(12) United States Patent
Noguchi et al.

(10) Patent No.: US 6,403,237 B1
(45) Date of Patent: Jun. 11, 2002

(54) POLYMERIC FLUORESCENT SUBSTANCE AND ORGANIC ELECTROLUMINESCENCE DEVICE

(75) Inventors: Takanobu Noguchi; Masamitsu Ishitobi; Makoto Kitano, all of Tsukuba (JP)

(73) Assignee: Sumitomo Chemical Co., Ltd., Osaka (JP)

( * ) Notice: Subject to any disclaimer, the term of this patent is extended or adjusted under 35 U.S.C. 154(b) by 0 days.

(21) Appl. No.: 09/327,501

(22) Filed: Jun. 8, 1999

(30) Foreign Application Priority Data

Jun. 10, 1998 (JP) ............................................. 10-162047

(51) Int. Cl.⁷ .......................... H05B 33/14; C08G 10/02
(52) U.S. Cl. ........................ 428/690; 428/704; 428/917; 313/504; 313/506; 257/40; 257/103; 252/301.16; 528/244; 528/232; 528/316; 528/398
(58) Field of Search ................................. 428/917, 690; 313/504, 506; 257/40, 103; 528/244, 232, 398, 316; 252/301.16

(56) References Cited

U.S. PATENT DOCUMENTS 5,759,709 A * 6/1998 Doi et al. .................. 428/690

FOREIGN PATENT DOCUMENTS

| EP | 0 725 120 | 8/1996 |
| EP | 0 825 242 | 2/1998 |
| WO | 90/13148 | 11/1990 |
| WO | 96/10617 | 4/1996 |
| WO | WO 96/10617 | 4/1996 |

OTHER PUBLICATIONS

J. M. Tousaint et al., Towards organic polymers with small intrinsic band gaps. II. Investigation of the electronic structure of poly(pyrenylene vinylenes), *J. Chem. Phys.*, vol. 91, No. 3, Aug. 1989, pp. 1783–1788.

Weast, R.C., Ed.: "CRC Handbook of Chemistry and Physics 69$^{th}$ Edition, 1988–1989", CRC Press, Florida, XP–002113964, pp. C–9–C13.

E.J.W. List et al., "Dynamics of photoexcitations in highly fluorescent organic guest–host–systems", *Optical Materials*, vol. 9, Jan. 1998, pp. 494–497.

* cited by examiner

*Primary Examiner*—Cynthia H. Kelly
*Assistant Examiner*—Ling Xu
(74) *Attorney, Agent, or Firm*—Sughrue Mion, PLLC

(57) ABSTRACT

Provided is a high heat-resistant polymeric fluorescent substance having a divalent condensed polycyclic aromatic group of specific size having a bonding part at specific position shows fluorescence at a long wave length from orange to red, which is useful for fabricating an organic EL device having excellent properties by a coating method.

10 Claims, No Drawings

POLYMERIC FLUORESCENT SUBSTANCE AND ORGANIC ELECTROLUMINESCENCE DEVICE

BACKGROUND OF THE INVENTION

1. Field of the Invention

The present invention relates to a polymeric fluorescent substance and an organic electroluminescence device (hereinafter, sometimes referred to as an organic EL device) fabricated by using the polymeric fluorescent substance.

2. Description of the Related Art

An inorganic electroluminescence device (hereinafter, sometimes referred to as an inorganic EL device) obtained by using as a luminescent material an inorganic fluorescent substance has been used for a flat light source as back light, a display apparatuses, such as a flat panel display and the like, however, this device requires high-voltage alternating current for driving the device.

From the standpoint of improvement in such an inorganic EL device, there have been reported a device having two-layer structure comprising a laminate of a light emitting layer composed of an organic fluorescent dye and a layer of an organic charge transporting compound (Japanese Patent Application Laid-Open (JP-A) No. 59-194393) and a device using a polymeric fluorescent substance as a luminescent material (WO 9013148, JP-A-3-244630). These electroluminescence devices using organic materials have feature that they can provide multi-color luminescence easily in addition to low voltage direct current activation and high luminance as compared with inorganic EL devices.

As polymeric fluorescent substance heretofore reported, WO 9013148 exemplifies a poly-p-phenylenevinylene film obtained by forming a film of a soluble precursor on an electrode and conducting heat treatment, and JP-A-3-244630 exemplifies conjugated polymers such as poly-2,5-dialkoxy-p-phenylenevinylene and the like which are themselves soluble in a solvent and required no heat treatment. WO 9610617 exemplifies as a conjugated polymer having a condensed polycyclic aromatic group in the main chain, a polyarylenevinylene-based polymeric fluorescent substance having a 2,7-pyrenediyl group in the main chain.

As polymeric fluorescent substances showing luminescent color having a long wave length from orange to red, there have been heretofore reported a polythiophene-based polymeric fluorescent substance (J. J. Appl. Phys., 30, L1938, (1991)) and a poly(arylenevinylene)-based polymeric fluorescent substance in which an electron withdrawing cyano group has been introduced into a vinylene group (WO 9429883), however, there has been reported no polymeric fluorescent substance containing a condensed polycyclic aromatic ring having a bonding part at specific position in the main chain of a poly(arylenevinylene)-based polymeric fluorescent substance and revealing luminescent color having a long wave length from orange to red.

The poly(arylenevinylene)-based polymeric fluorescent substances used in organic EL devices heretofore reported have had restriction that when they are obtained via intermediates soluble in solvents, heat treatment is necessary and only substrates having high heat-resistance can be used. Further, there has been a problem that, for obtaining a polymeric fluorescent substance soluble in a solvent, introduction of a flexible repeating unit into the main chain or introduction of a flexible side chain having high affinity with a solvent is required and heat-resistance of the device decreases when temperature is raised since then the polymeric fluorescent substance is easily softened.

An object of the present invention is to provide a polymeric fluorescent substance which shows fluorescence at a long wave length from orange to red, has excellent heat-resistance and is soluble in a solvent, and an organic EL device having excellent properties which can be easily fabricated by a coating method using the same.

The present inventors, in view of such conditions, have intensively studied to improve heat-resistance and luminescent property of an organic EL device using as a light emitting layer a polymeric fluorescent substance showing luminescent color from orange to red. As a result, the present inventors have found that a polymeric fluorescent substance having a divalent condensed polycyclic aromatic group of specific size having a bonding part at specific position shows fluorescence at a long wave length from orange to red and has high heat-resistance, and an organic EL device can be easily fabricated by a coating method using the above-described polymeric fluorescent substance and, further, this organic EL device exhibits excellent property, and completed the present invention.

SUMMARY OF THE INVENTION

Namely, the present invention relates to (1) a polymeric fluorescent substance showing visible fluorescence in solid state and having a polystyrene-reduced number-average molecular weight of $10^3$ to $10^7$, wherein the polymeric fluorescent substance comprises one or more repeating units represented by the following formula (1) and the amount of these repeating units is from 0.5% by mole to 100% by mole based on the total amount of repeating units:

$$—Ar_1—CR_1=CR_2— \quad (1)$$

(wherein, $Ar_1$ represents a condensed polycyclic aromatic group which may be substituted with a substituent selected from the group consisting of a cyano group, an alkyl group having 1 to 20 carbon atoms, an alkoxy group and alkylthio group having 1 to 20 carbon atoms, an alkylsilyl group having 3 to 60 carbon atoms, an alkylamino group having 1 to 40 carbon atoms, an aryl group having 6 to 20 carbon atoms, an aryloxy group having 6 to 20 carbon atoms, an arylalkenyl group having 8 to 20 carbon atoms, an arylalkynyl group having 8 to 20 carbon atoms, an aralkyl group having 7 to 14 carbon atoms and a heterocyclic compound group having 4 to 14 carbon atoms, and which satisfies the following condition (a) to (c):

(a) the condensed polycyclic aromatic group has two bonding parts which are not adjacent each other, and the number of carbon atoms forming conjugated bonds excepting carbon atoms of said substituent is from 16 to 30;

(b) a condensed polycyclic aromatic compound obtained by substituting all substituent on $Ar_1$ by hydrogen atoms and by allowing the two bonding parts to be bonded to hydrogen atoms has a plane of symmetry or a twofold axis or threefold axis vertical to the plane including the condensed polycyclic aromatic compound and contains only 6-membered-ring structures;

(c) two carbon atoms selected according to the following method have a bonding part:

any one of the highest occupied molecular orbitals of the condensed polycyclic aromatic compound of (b) determined by a semi-empirical molecular orbital method, AM1 method is selected, the sum of squares of atomic orbital coefficients of only carbon atoms to which a hydrogen atom is bonded among carbon atoms in the condensed polycyclic aromatic compound of (b), and two carbon atoms are selected from the group consisting of carbon atoms having the largest and second-largest sum value as the carbon atoms having a bonding part; and $R_1$ and $R_2$ each independently represents a group selected from the group consisting of a hydrogen atom, an alkyl group having 1 to 20 carbon atoms, an aryl group having 6 to 20 carbon atoms, a heterocyclic compound having 4 to 20 carbon atoms and a cyano group.).

Further, the present invention relates to (2) a polymeric fluorescent substance showing visible fluorescence in solid state and having a polystyrene-reduced number-average molecular weight of $10^3$ to $10^7$, wherein the polymeric fluorescent substance comprises one or more repeating units represented by said formula (1) and one or more repeating units represented by the following formula (2), the sum of the repeating units represented by the formula (1) is from 0.5% by mole to 95% by mole based on the total amount of repeating units, the sum of the repeating units represented by the formula (1) and the repeating units represented by the formula (2) is from 50% by mole to 100% by mole based on the total amount of repeating units, and the molar ratio of the sum of the repeating units represented by the formula (1) to the sum of the repeating units represented by the formula (2) is from 20:1 to 1:199:

$$-Ar_2-CR_3=CR_4- \quad (2)$$

(wherein, $Ar_2$ represents an arylene group or a heterocyclic compound in which the number of carbon atoms forming conjugated bond is from 4 to 20, and is not the same as the $Ar_1$ group in said formula (1), and $R_3$ and $R_4$ each independently represents a group selected from the group consisting of a hydrogen atom, an alkyl group having 1 to 20 carbon atoms, an aryl group having 6 to 20 carbon atoms, a heterocyclic compound having 4 to 20 carbon atoms and a cyano group.).

Further, the present invention relates to an organic electroluminescence device having at least a light emitting layer between a pair of electrodes consisting of an anode and cathode at least one of which is transparent or semitransparent, wherein the light emitting layer contains the polymeric fluorescent substance according to [1] or [2].

DETAILED DESCRIPTION OF THE INVENTION

The present invention will be described in detail below.

The polymeric fluorescent substance (1) of the present invention is a polymeric fluorescent substance showing visible fluorescence in solid state and having a polystyrene-reduced number-average molecular weight of $10^3$ to $10^7$, wherein the polymeric fluorescent substance comprises one or more repeating units represented by the following formula (1) and the amount of these repeating units is from 0.5% by mole to 100% by mole based on the total amount of repeating units:

$$-Ar_1-CR_1=CR_2- \quad (1)$$

(wherein,
$Ar_1$ represents a condensed polycyclic aromatic group which may be substituted with a substituent selected from the group consisting of a cyano group, an alkyl group having 1 to 20 carbon atoms, an alkoxy group and alkylthio group having 1 to 20 carbon atoms, an alkylsilyl group having 3 to 60 carbon atoms, an alkylamino group having 1 to 40 carbon atoms, an aryl group having 6 to 20 carbon atoms, an aryloxy group having 6 to 20 carbon atoms, an arylalkenyl group having 8 to 20 carbon atoms, an arylalkynyl group having 8 to 20 carbon atoms, an aralkyl group having 7 to 14 carbon atoms and a heterocyclic compound group having 4 to 14 carbon atoms, and which satisfies the following condition (a) to (c):

(a) the condensed polycyclic aromatic group has two bonding parts which are not adjacent each other, and the number of carbon atoms forming conjugated bonds excepting carbon atoms of said substituent is from 16 to 30;

(b) a condensed polycyclic aromatic compound obtained by substituting all substituent on $Ar_1$ by hydrogen atoms and by allowing the two bonding parts to be bonded to hydrogen atoms has a plane of symmetry or a twofold axis or threefold axis vertical to the plane including the condensed polycyclic aromatic compound and contains only 6-membered-ring structures;

(c) two carbon atoms selected according to the following method have a bonding part:

any one of the highest occupied molecular orbitals of the condensed polycyclic aromatic compound of (b) determined by a semi-empirical molecular orbital method, AM1 method is selected, the sum of squares of atomic orbital coefficients of only carbon atoms to which a hydrogen atom is bonded among carbon atoms in the condensed polycyclic aromatic compound of (b), and two carbon atoms are selected from the group consisting of carbon atoms having the largest and second-largest sum value as the carbon atoms having a bonding part; and $R_1$ and $R_2$ each independently represents a group selected from the group consisting of a hydrogen atom, an alkyl group having 1 to 20 carbon atoms, an aryl group having 6 to 20 carbon atoms, a heterocyclic compound having 4 to 20 carbon atoms and a cyano group.).

Among them, the above-described Ar1 preferably satisfies the conditions (a), (b) and the following condition (c').

(c') two carbon atoms selected according to the following method have a bonding part:

any one of the highest occupied molecular orbitals of the condensed polycyclic aromatic compound of (b) determined by a semi-empirical molecular orbital method is selected, the sum of squares of atomic orbital coefficients of only carbon atoms to which a hydrogen atom is bonded among carbon atoms in the condensed polycyclic aromatic compound of (b), and two carbon atoms are selected from the group consisting of carbon atoms having the largest sum value as the carbon atoms having a bonding part.

Here, the phrase "a condensed polycyclic aromatic compound obtained by substituting all substituent on $Ar_1$ by hydrogen atoms and by allowing the two bonding parts to be bonded to hydrogen atoms has a plane of symmetry or a twofold axis or threefold axis vertical to the plane including the condensed polycyclic aromatic compound" of (b) means that when the plane structure of the condensed polycyclic aromatic compound is represented by a usually used plane structural formula as shown in Formula (I) (each benzene nucleus is represented by a regular hexagon), the plane containing the condensed polycyclic aromatic compound is the plane of this paper where the plane structural formula is shown, and the compound has a plane of symmetry or a twofold axis or threefold axis vertical to the above-described plane.

[Formula (I)]

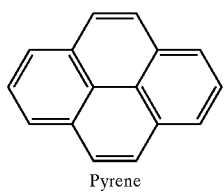
Pyrene

The judgement of symmetry is effected based on the above-described two-dimensional plane structural formula. Herein, bonds in a regular hexagon showing conjugated double bonds are not to be taken into consideration in judging symmetry. For example, when pyrene is represented as shown in Formula (I) and bonds in a regular hexagon are taken into consideration, pyrene shall not have symmetrical plane, however, in the present invention, pyrene has symmetrical plane since bonds in a regular hexagon are not taken into consideration.

The sum of squares of atomic orbital coefficients in the highest occupied molecular orbitals (HOMO) of carbon atoms in (c) and (c') ($\rho_m^{HOMO}$) is obtained according to the following formula by a semi-empirical molecular orbital method, AM1 method (Dewar, M. J. S. et.al., J. Am. Chem. Soc., 107, 3902 (1985)).

$$\rho_m^{HOMO} = \Sigma_u (C_{mu}^{HOMO})^2$$

Herein, m represents a mark showing a carbon atom, u represents a mark showing atomic orbital taken into consideration in the AM1 method corresponding to the carbon atom. $C_{mu}^{HOMO}$ represents atomic orbital coefficient represented by u of HOMO of the carbon atom.

Comparison of atomic orbital coefficients is conducted in two significant figures. When the highest sum of squares of atomic orbital coefficients shown in two significant figures is found at several carbon atoms, all of these carbon atoms are admitted to have the highest sum of squares, and other carbon atoms having the second-highest sum of squares can be selected. When two HOMOs are present, any one may advantageously be selected and comparison of the sum of squared of atomic orbital coefficients.

$Ar_1$ may be substituted with a substituent selected from the group consisting of a cyano group, an alkyl group having 1 to 20 carbon atoms, an alkoxy group and alkylthio group having 1 to 20 carbon atoms, an alkylsilyl group having 3 to 60 carbon atoms, an alkylamino group having 1 to 40 carbon atoms, an aryl group having 6 to 20 carbon atoms, an aryloxy group having 6 to 20 carbon atoms, an arylalkenyl group having 8 to 20 carbon atoms, an arylalkynyl group having 8 to 20 carbon atoms, an aralkyl group having 7 to 14 carbon atoms and a heterocyclic compound group having 4 to 14 carbon atoms, and a substituent on a carbon atom adjacent to a carbon atom at bonding position is preferably a hydrogen atom.

As the $Ar_1$, there are specifically exemplified divalent condensed polycyclic aromatic groups or derivative groups thereof or repeating units obtained by combination thereof.

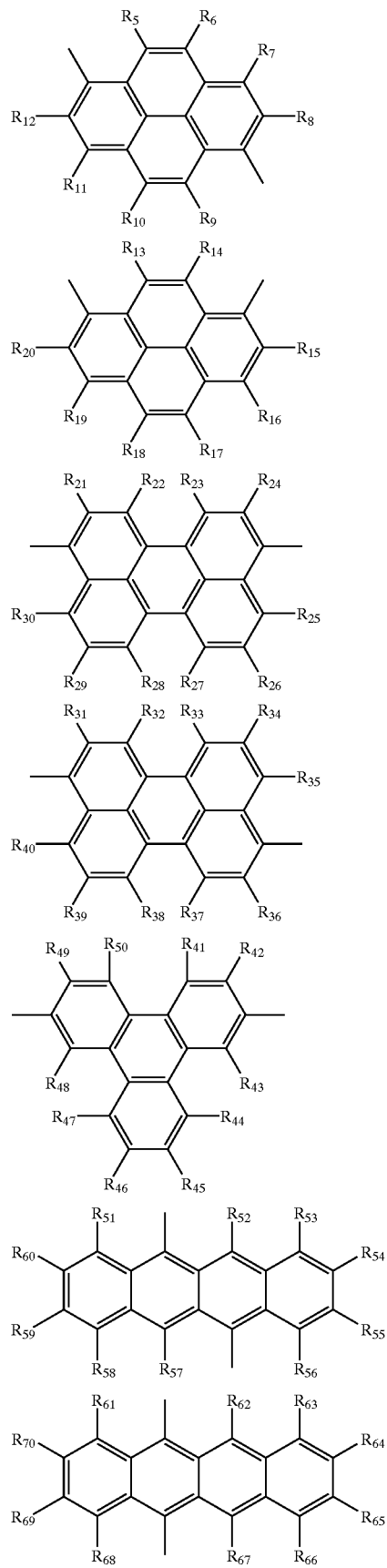

-continued

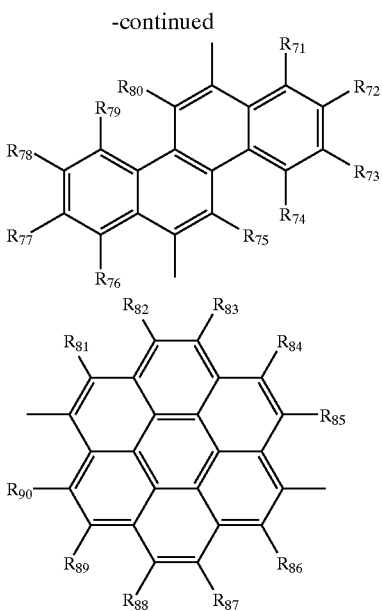

(wherein, $R_5$ to $R_{90}$ each independently represents a group selected from the group consisting of a hydrogen atom, a cyano group, an alkyl group having 1 to 20 carbon atoms, an alkoxy group or alkylthio group having 1 to 20 carbon atoms; an alkylsilyl group having 3 to 60 carbon atoms; an alkylamino group having 1 to 40 carbon atoms; an aryl group having 6 to 20 carbon atoms; an aryloxy group having 6 to 20 carbon atoms; arylalkenyl group having 8 to 20 carbon atoms; an arylalkynyl group having 8 to 20 carbon atoms; an aralkyl group having 7 to 14 carbon atoms; and a heterocyclic compound group having 4 to 14 carbon atoms.)

Among them, preferable are a 1,6-pyrenediyl group, a 1,8-pyrenediyl group, a 3,6-perylenediyl group and a 3,9-perylenediyl group and, which may be substituted with a substituent selected from the group consisting of a cyano group, an alkyl group having 1 to 20 carbon atoms, an alkoxy group and alkylthio group having 1 to 20 carbon atoms, an alkylsilyl group having 3 to 60 carbon atoms, an alkylamino group having 1 to 40 carbon atoms, an aryl group having 6 to 20 carbon atoms, an aryloxy group having 6 to 20 carbon atoms, an arylalkenyl group having 8 to 20 carbon atoms, an arylalkynyl group having 8 to 20 carbon atoms, an aralkyl group having 7 to 14 carbon atoms and a heterocyclic compound group having 4 to 14 carbon atoms.

Specific examples of $R_5$ to $R_{90}$ other than a hydrogen atom and a cyano group are listed below.

Examples of the alkyl group include a methyl group, ethyl group, propyl group, butyl group, pentyl group, hexyl group, heptyl group, octyl group, nonyl group, decyl group, lauryl group and the like.

Examples of the alkoxy group include a methoxy group, ethoxy group, propyloxy group, butoxy group, pentyloxy group, hexyloxy group, heptyloxy group, octyloxy group, nonyloxy group, decyloxy group, lauryl group and the like.

Examples of the alkylthio group include a methylthio group, ethylthio group, propylthio group, butylthio group, pentylthio group, hexylthio group, heptylthio group, octylthio group, nonylthio group, decylthio group, laurylthio group and the like.

Examples of the alkylsilyl group include a trimethylsilyl group, triethylsilyl group, tripropylsilyl group, tributylsilyl group, tripentylsilyl group, trihexylsilyl group, triheptylsilyl group, trioctylsilyl group, trinonylsilyl group, tridecylsilyl group, trilaurylsilyl group, ethyldimethylsilyl group, propyldimethylsilyl group, butyldimethylsilyl group, pentyldimethylsilyl group, hexyldimethylsilyl group, heptyldimethylsilyl group, octyldimethylsilyl group, nonyldimethylsilyl group, decyldimethylsilyl group, lauryldimethylsilyl group and the like.

Examples of the alkylamino group include a methylamino group, ethylamino group, propylamino group, butylamino group, pentylamino group, hexylamino group, heptylamino group, octylamino group, nonylamino group, decylamino group, laurylamino group, dimethylamino group, diethylamino group, dipropylamino group, dibutylamino group, dipentylamino group, dihexylamino group, diheptylamino group, dioctylamino group, dinonylamino group, didecylamino group, dilaurylamino group and the like.

Examples of the aryl group include a phenyl group, $C_1$ to $C_{12}$ alkoxyphenyl group ($C_1$ to $C_{12}$ means that the number of carbon atoms is from 1 to 12. Hereinafter, the same), $C_1$ to $C_{12}$ alkylphenyl group, 1-naphthyl group, 2-naphthyl group and the like.

Examples of the aryloxy group include a phenoxy group, $C_1$ to $C_{12}$ alkoxyphenoxy group, $C_1$ to $C_{12}$ alkylphenoxy group, 1-naphthyloxy group, 2-naphthyloxy group and the like.

Examples of the arylalkenyl group include a phenylethenyl group, $C_1$ to $C_{12}$ alkoxyphenylethenyl group, $C_1$ to $C_{12}$ alkylphenylethenyl group, naphthylethenyl group, anthrylethenyl group, pyrenylethenyl group and the like.

Examples of the arylalkynyl group include a phenylethynyl group, $C_1$ to $C_{12}$ alkoxyphenylethynyl group, $C_1$ to $C_{12}$ alkylphenylethynyl group, naphthylethynyl group, anthrylethynyl group, pyrenylethynyl group and the like.

Examples of the aralkyl group include a benzyl group, phenylethyl group, phenylpropyl group, naphthylmethyl group and the like.

Examples of the heterocyclic group include a thienyl group, $C_1$ to $C_{12}$ alkylthienyl group, pyrrolyl group, furyl group, pyridyl group, $C_1$ to $C_{12}$ alkylpyridyl group and the like.

In the polymeric fluorescent substance of the present invention, the amount of repeating units represented by the formula (1) is from 0.5% by mole to 100% by mole based on the total amount of repeating units. Preferably, the amount of repeating units represented by the formula (1) is from 5% by mole to 100% by mole based on the total amount of repeating units, though it depends on the structure of the repeating unit. More preferably, the amount of repeating units represented by the formula (1) is from 20% by mole to 100% by mole based on the total amount of repeating units.

$R_1$ and $R_2$ in the formula (1) each independently represents a group selected from the group consisting of a hydrogen atom, an alkyl group having 1 to 20 carbon atoms, an aryl group having 6 to 20 carbon atoms, a heterocyclic compound having 4 to 20 carbon atoms and a cyano group.

Specific examples of $R_1$ and $R_2$ other than a hydrogen atom and a cyano group are listed below.

Examples of the alkyl group include a methyl group, ethyl group, propyl group, butyl group, pentyl group, hexyl group, heptyl group, octyl group, decyl group, dodecyl and the like, and preferably include a methyl group, ethyl group, pentyl group, hexyl group, heptyl group and octyl group.

Examples of the aryl group include a phenyl group, $C_1$ to $C_{12}$ alkoxyphenyl group, $C_1$ to $C_{12}$ alkylphenyl group, 1-naphthyl group, 2-naphthyl group and the like. Examples of the heterocyclic compound group include a 2-pyridyl group, 2-quinolyl group and the like.

The polymeric fluorescent substance (2) of the present invention is a polymeric fluorescent substance showing visible fluorescence in solid state and having a polystyrene-reduced number-average molecular weight of $10^3$ to $10^7$, wherein the polymeric fluorescent substance comprises one or more repeating units represented by the above-described formula (1) and one or more repeating units represented by the above-described formula (2), the sum of the repeating units represented by the formula (1) is from 0.5% by mole to 95% by mole based on the total amount of repeating units, the sum of the repeating units represented by the formula (1) and the repeating units represented by the formula (2) is from 50% by mole to 100% by mole based on the total amount of repeating units, and the molar ratio of the sum of the repeating units represented by the formula (1) to the sum of the repeating units represented by the formula (2) is from 20:1 to 1:199:

The amount of repeating units represented by the formula (1) is from 0.5% by mole to 95% by mole based on the total amount of repeating units. Preferably, the amount of repeating units represented by the formula (1) is from 5% by mole to 95% by mole based on the total amount of repeating units, though it depends on the structure of the repeating unit. More preferably, the amount of repeating units represented by the formula (1) is from 30% by mole to 95% by mole based on the total amount of repeating units.

The amount of repeating units represented by the formula (1) and repeating units represented by the formula (2) is from 50% by mole to 100% by mole based on the total amount of repeating units. Preferably, it is from 70% by mole to 100% by mole based on the total amount of repeating units, though it depends on the structure of the repeating unit.

Further, the molar ratio of the sum of the repeating units represented by the formula (1) to the sum of the repeating units represented by the formula (2) is from 20:1 to 1:199. The molar ratio is preferably 20:1 to 1:20, more preferably from 9:1 to 1:9, particularly preferably from 9:1 to 1:4, though it depends on the structure of the repeating unit.

$Ar_2$ in the formula (2) represents an arylene group or a heterocyclic compound group having 4 to 20 carbon atoms forming conjugated bonds.

Specifically, compound groups described in JP-A 10-46138 are listed.

Among them, preferable are a 1,4-phenylene group, 2,6-naphthalenediyl group, 9,10-anthracenediyl group, 2,5-pyridinediyl group, 2,5-thienylene group or derivatives thereof, 1,3-phenylene group, 1,3-naphthalenylene group, 2,6-pyridinediyl group, 2,4-quinolinediyl group or derivatives thereof, and more preferable are a 1,4-phenylene group, 2,6-pyridinediyl group, 2,5-thienylene group, 1,3-phenylene group, 2,6-pyridinediyl group, 2,4-quinolinediyl group, or derivatives of these compound groups obtained by substitution with a substituent selected from the group consisting of a cyano group, an alkyl group having 1 to 20 carbon atoms, an alkoxy group and alkylthio group having 1 to 20 carbon atoms, an alkylsilyl group having 3 to 60 carbon atoms, an alkylamino group having 1 to 40 carbon atoms, an aryl group having 6 to 20 carbon atoms, an aryloxy group having 6 to 20 carbon atoms, an arylalkenyl group having 8 to 20 carbon atoms, an arylalkynyl group having 8 to 20 carbon atoms, an aralkyl group having 7 to 14 carbon atoms and a heterocyclic compound group having 4 to 14 carbon atoms. One or two kinds of groups can be selected from these groups.

Specific examples of the above-described substituents are listed below.

Examples of the alkyl group include a methyl group, ethyl group, propyl group, butyl group, pentyl group, hexyl group, heptyl group, octyl group, nonyl group, decyl group, lauryl group and the like.

Examples of the alkoxy group include a methoxy group, ethoxy group, propyloxy group, butoxy group, pentyloxy group, hexyloxy group, heptyloxy group, octyloxy group, nonyloxy group, decyloxy group,-lauryl group and the like.

Examples of the alkylthio group include a methylthio group, ethylthio group, propylthio group, butylthio group, pentylthio group, hexylthio group, heptylthio group, octylthio group, nonylthio group, decylthio group, laurylthio group and the like.

Examples of the alkylsilyl group include a trimethylsilyl group, triethylsilyl group, tripropylsilyl group, tributylsilyl group, tripentylsilyl group, trihexylsilyl group, triheptylsilyl group, trioctylsilyl group, trinonylsilyl group, tridecylsilyl group, trilaurylsilyl group, ethyldimethylsilyl group, propyldimethylsilyl group, butyldimethylsilyl group, pentyldimethylsilyl group, hexyldimethylsilyl group, heptyldimethylsilyl group, octyldimethylsilyl group, nonyldimethylsilyl group, decyldimethylsilyl group, lauryldimethylsilyl group and the like.

Examples of the alkylamino group include a methylamino group, ethylamino group, propylamino group, butylamino group, pentylamino group, hexylamino group, heptylamino group, octylamino group, nonylamino group, decylamino group, laurylamino group, dimethylamino group, diethylamino group, dipropylamino group, dibutylamino group, dipentylamino group, dihexylamino group, diheptylamino group, dioctylamino group, dinonylamino group, didecylamino group, dilaurylamino group and the like.

Examples of the aryl group include a phenyl group, $C_1$ to $C_{12}$ alkoxyphenyl group, $C_1$ to $C_{12}$ alkylphenyl group, 1-naphthyl group, 2-naphthyl group and the like.

Examples of the aryloxy group include a phenoxy group, $C_1$ to $C_{12}$ alkoxylphenoxy group, $C_1$ to $C_{12}$ alkylphenoxy group, 1-naphthyloxy group, 2-naphthyloxy group and the like.

Examples of the arylalkenyl group include a phenylethenyl group, $C_1$ to $C_{12}$ alkoxyphenylethenyl group, $C_1$ to $C_{12}$ alkylphenylethenyl group, naphthylethenyl group, anthrylethenyl group, pyrenylethenyl group and the like.

Examples of the arylalkynyl group include a phenylethynyl group, $C_1$ to $C_{12}$ alkoxyphenylethynyl group, $C_1$ to $C_{12}$ alkylphenylethynyl group, naphthylethynyl group, anthrylethynyl group, pyrenylethynyl group and the like.

Examples of the aralkyl group include a benzyl group, phenylethyl group, phenylpropyl group, naphthylmethyl group and the like.

Examples of the heterocyclic group include a thienyl group, $C_1$ to $C_{12}$ alkylthienyl group, pyrrolyl group, furyl group, pyridyl group, $C_1$ to $C_{12}$ alkylpyridyl group and the like.

$R_3$ and $R_4$ bonded to the vinylene group in the repeating unit of the formula (2) each independently represents a group selected from the group consisting of a hydrogen atom, an alkyl group having 1 to 20 carbon atoms, an aryl group having 6 to 20 carbon atoms, a heterocyclic compound having 4 to 20 carbon atoms and a cyano group.

Specific examples of $R_3$ and $R_4$ other than a hydrogen atom and a cyano group are listed below.

Examples of the alkyl group include a methyl group, ethyl group, propyl group, butyl group, pentyl group, hexyl group, heptyl group, octyl group, decyl group, dodecyl and the like, and preferably include a methyl group, ethyl group, pentyl group, hexyl group, heptyl group and octyl group.

Examples of the aryl group include a phenyl group, $C_1$ to $C_{12}$ alkoxyphenyl group, $C_1$ to $C_{12}$ alkylphenyl group, 1-naphthyl group, 2-naphthyl group and the like. Examples of the heterocyclic compound group include a 2-pyridyl group, 2-quinolyl group and the like.

The terminal group of the polymeric fluorescent substance used in the present invention is not particularly restricted. However, if a polymerization active group remains as it is, there is possibility of reduction of luminescent property and life time of a device when the polymeric fluorescent substance is used in the device. Therefore, it is preferable that the terminal group is a stable group. The terminal group has more preferably a conjugated bond continuous with conjugated structure of the main chain and as a stable terminal group there is exemplified an aryl group or a heterocyclic compound group bonding to the main chain via a vinylene group.

Specifically, there are exemplified aromatic compound groups described below or derivative groups thereof, and groups formed by bond of a vinylene group with them.

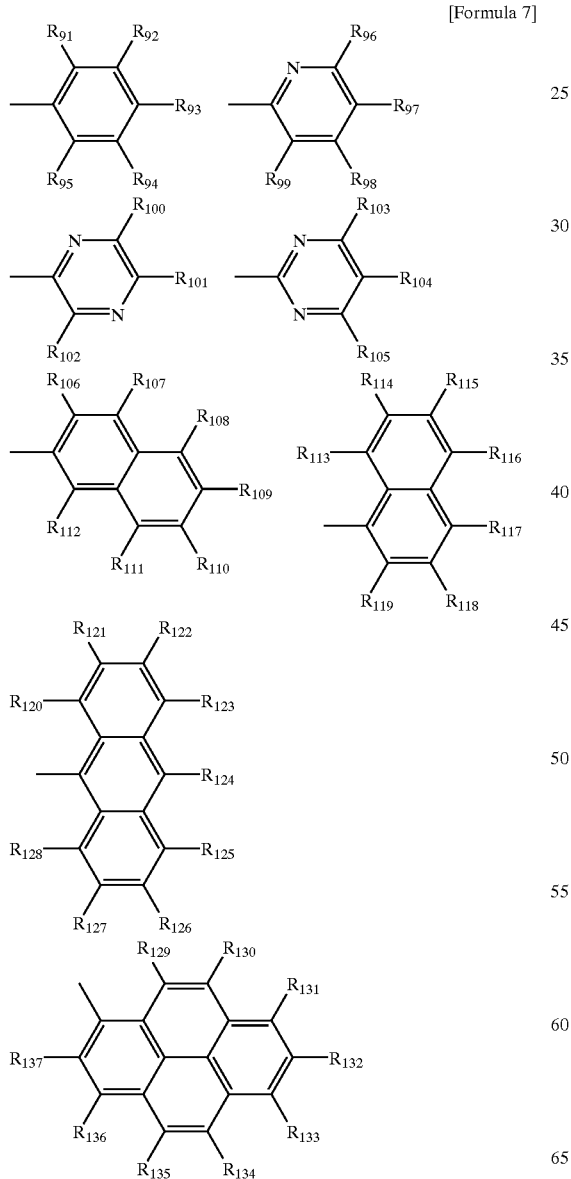

[Formula 7]

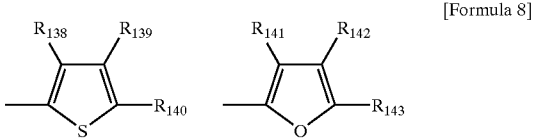

[Formula 8]

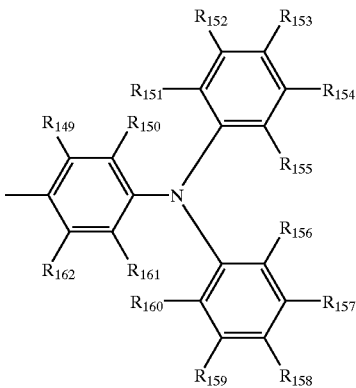

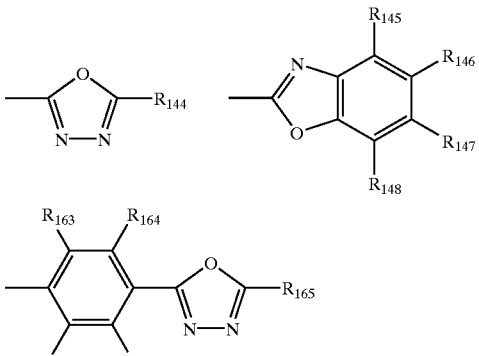

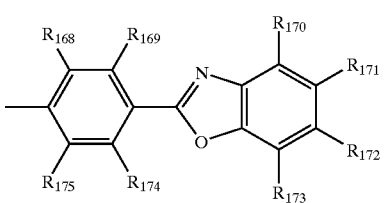

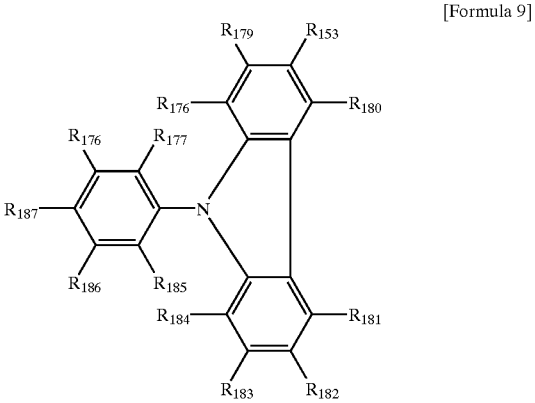

[Formula 9]

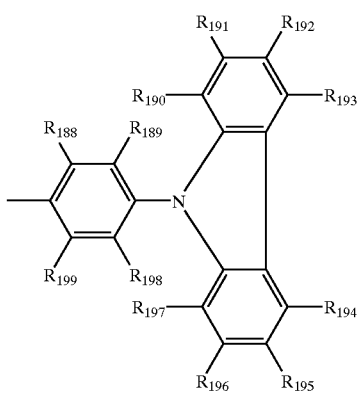

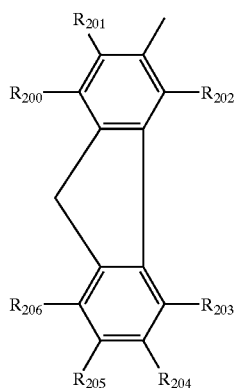

[Formula 10]

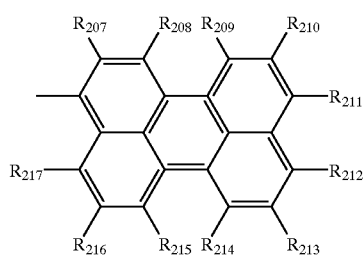

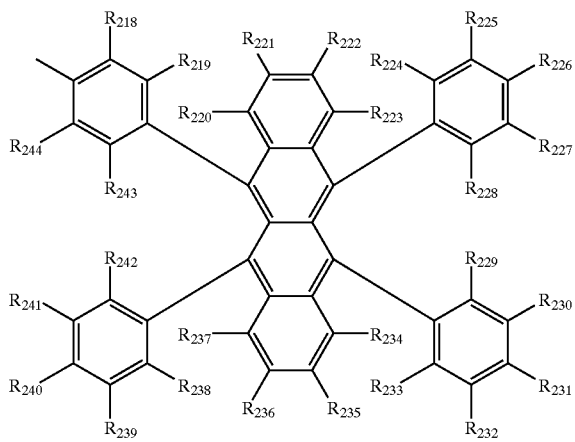

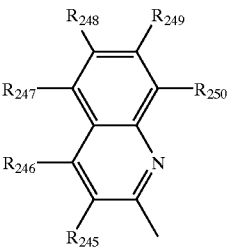
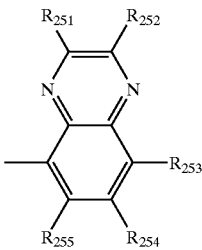

(wherein, $R_{91}$ to $R_{255}$ each independently represents a group selected from the group consisting of a hydrogen atom, a cyano group, an alkyl group having 1 to 20 carbon atoms, an alkoxy group and alkylthio group having 1 to 20 carbon atoms; an aryl group and aryloxy group having 6 to 20 carbon atoms; an aralkyl group having 7 to 14 carbon atoms; and a heterocyclic compound group having 4 to 14 carbon atoms.)

Among them, a phenyl group, 1-naphthyl group, 9-anthryl group, 2-pyridyl group, 2-thienyl group, oxadiazolyl group, benzooxazolyl group, 4-(N,N-diphenylamino)phenyl group, 1-pyrenyl group, 2-fluorenyl group, 2-quinolyl group, 4-(9-carbazolyl)phenyl group, 9-phenyl-3-carbazolyl group, or derivatives of these compound groups obtained by substitution with a substituent selected from the group consisting of a cyano group, an alkyl group having 1 to 20 carbon atoms, an alkoxy group and alkylthio group having 1 to 20 carbon atoms, an aryl group and aryloxy group having 6 to 20 carbon atoms, an aralkyl group having 7 to 14 carbon atoms and a heterocyclic compound group having 4 to 14 carbon atoms are preferable.

More preferably, there are listed 1-naphthyl group, 9-anthryl group, oxadiazolyl group, 4-(N,N-diphenylamino) phenyl group, 1-pyrenyl group, 2-fluorenyl group, 2-quinolyl group, 4-(9-carbazolyl)phenyl group, 9-phenyl-3-carbazolyl group, or derivatives of these compound groups obtained by substitution with a substituent selected from the group consisting of a cyano group, an alkyl group having 1 to 20 carbon atoms, an alkoxy group and alkylthio group having 1 to 20 carbon atoms, an aryl group and aryloxy group having 6 to 20 carbon atoms, an aralkyl group having 7 to 14 carbon atoms and a heterocyclic compound group having 4 to 14 carbon atoms, and particularly preferably, there are listed 1-naphthyl group, 9-anthryl group, 1-pyrenyl group, 2-fluorenyl group, or derivatives of these compound groups obtained by substitution with a substituent selected from the group consisting of a cyano group, an alkyl group having 1 to 20 carbon atoms, an alkoxy group and alkylthio group having 1 to 20 carbon atoms, an aryl group and aryloxy group having 6 to 20 carbon a,toms, an aralkyl group having 7 to 14 carbon atoms and a heterocyclic compound group having 4 to 14 carbon atoms.

Specific examples of $R_{91}$ to $R_{255}$ other than a hydrogen atom and a cyano group are listed below.

Examples of the alkyl group include a methyl group, ethyl group, propyl group, butyl group, pentyl group, hexyl group, heptyl group, octyl group, nonyl group, decyl group, lauryl group and the like.

Examples of the alkoxy group include a methoxy group, ethoxy group, propyloxy group, butoxy group, pentyloxy group, hexyloxy group, heptyloxy group, octyloxy group, decyloxy group, dodecyloxy group and the like.

Examples of the alkylthio group include a methylthio group, ethylthio group, propylthio group, butylthio group, pentylthio group, hexylthio group, heptylthio group, octylthio group, decylthio group, dodecythio group and the like.

Examples of the aryl group include a phenyl group, $C_1$ to $C_{12}$ alkoxyphenyl group, $C_1$ to $C_{12}$ alkylphenyl group, naphthyl group, anthryl group and the like.

Examples of the aryloxy group include a phenoxy group, $C_1$ to $C_{12}$ alkoxylphenoxy group, $C_1$ to $C_{12}$ alkylphenoxy group, naphthyloxy group and the like.

Examples of the aralkyl group include a benzyl group, phenylethyl group, phenylpropyl group, naphthylmethyl group and the like.

Examples of the heterocyclic group include a 2-pyridyl group, 2-quinolyl group and the like.

The degree of polymerization of the polymeric fluorescent substance of the present invention is not particularly restricted providing a polystyrene-reduced number-average molecular weight is from $10^3$ to $10^7$, and it differs depending on repeating structure and proportion thereof. From the standpoint of film-forming property, the usual total number of repeating structures is preferably from 4 to 10000, more preferably 5 to 3000, particularly preferably from 10 to 2000. Herein, the molecular weight is a polystyrene-reduced number-average molecular weight given by gel permeation chromatography (GPC) using chloroform as a solvent.

The polymeric fluorescent substance of the present invention is a polymer or copolymer comprising only the repeating unit represented by the formula (1), a copolymer comprising the repeating unit represented by the formula (1) and the repeating unit represented by the formula (2), or a copolymer in which the total amount of the repeating unit represented by the formula (1) and the repeating unit represented by the formula (2) is 50% by mole or more based on the total amount of all repeating units. In the case of the copolymer, it may be a random, block or graft copolymer, or a polymer having intermediate structure thereof, for example, a random copolymer having block polymer tendency. From the standpoint of obtaining a copolymer showing high quantum efficiency of fluorescence, a random copolymer having block polymer tendency and a block or graft copolymer are more preferable than a complete random copolymer, and copolymers having branched chain in the main chain and having three or more terminals are also included.

The polymeric fluorescent substance of the present invention can be dissolved in a solvent and a film of the polymeric fluorescent substance can be formed.

Examples of the good solvent for the polymeric fluorescent substance include chloroform, methylene chloride, dichloroethane, tetrahydrofuran, toluene, xylene and the like. The polymeric fluorescent substance can usually be dissolved in these solvents in an amount of 0.1% by weight or more though the amount differs depending on the structure and molecular weight of the polymeric fluorescent substance.

It is advantageous in fabrication to use these solvent-soluble polymeric fluorescent substances in fabricating an organic EL device, since when a film is formed from a solution, necessity is only removal of a solvent by drying after coating of this solution, and the same method can be applied also in the case of the polymeric fluorescent substances mixed with a charge transporting material described below.

For producing the polymeric fluorescent substance of the present invention, a polymer containing the repeating unit represented by the formula (1) or the formula (2) is synthesized by carbon-carbon double bond formation reaction. When a specific stable group is introduce into the main chain as a terminal group, the above-described reaction may advantageously be followed by a reaction with a monomer forming the terminal group. As the carbon-carbon double bond formation reaction used in the present invention, there are exemplified Wittig reaction, Horner-Wadsworth-Emmons reaction, dehydrohalogenation method, sulfonium salt decomposing method, Knoevenagel reaction, Heck reaction and the like.

In the Wittig reaction, for example, a dialdehyde compound represented by the formula (3) and a diphosphonium salt compound represented by the formula (4) are reacted. $Ar_3$ and $Ar_4$ may be the same or different. When different, an alternating copolymer is obtained. Further, when two or more kinds of dialdehyde compounds and/or two or more kinds diphosphonium salt compounds are used, a copolymer comprising all of these monomers are obtained.

$$\text{OHC—Ar}_3\text{—CHO} \qquad (3)$$

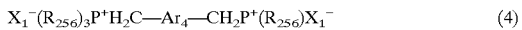

$$X_1^-(R_{256})_3P^+H_2C\text{—Ar}_4\text{—CH}_2P^+(R_{256})X_1^- \qquad (4)$$

(wherein, $Ar_3$ and $Ar_4$ each independently is selected from the groups represented by $Ar_1$ in the formula (1) or $Ar_2$ in the formula (2), with the proviso that the group represented by $Ar_1$ in the formula (1) is contained in given amount after polymerization. $X_1^-$ represents a counter ion and halide ions and the like are exemplified. As $R_{256}$, a phenyl group, butyl group and the like are exemplified.).

In the dehydrohalogenation method, an aromatic compound having methyl halide groups bonded to both ends is polycondensed.

$$X_2R_{257}HC\text{—Ar}_5\text{—CHR}_{258}X_2 \qquad (5)$$

(wherein, $Ar_5$ has the same definition as for $Ar_1$ in the formula (1) or $Ar_2$ in the formula (2), with the proviso that the group represented by $Ar_1$ in the formula (1) has to be contained in given amount after polymerization. $X_2$ represents a halogen atom, $R_{257}$ and $R_{258}$ each independently represents a group selected from the group consisting of a hydrogen atom, cyano group, an alkyl group having 1 to 20 carbon atoms, aryl group having 6 to 20 carbon atoms and heterocyclic compound group having 4 to 14 carbon atoms.)

In the sulfonium salt decomposing method, an aromatic compound having sulfonium salts bonded to both ends is polycondensed.

$$X_3^-R_{259}R_{260}S^+R_{261}HC\text{—Ar}_6\text{—CHR}_{262}S^+R_{263}R_{264}X_3^- \qquad (6)$$

(wherein, $Ar_6$ has the same definition as for $Ar_1$ in the formula (1) or $Ar_2$ in the formula (2), with the proviso that the group represented by $Ar_1$ in the formula (1) has to be contained in given amount after polymerization. $X_3$ represents a counter ion, and $R_{261}$ and $R_{262}$ each independently represents a group selected from the group consisting of a hydrogen atom, cyano group, an alkyl group having 1 to 20 carbon atoms, alkoxy group and alkylthio group having 1 to 20 carbon atoms; aryl group and aryloxy group having 6 to 20 carbon atoms; and heterocyclic compound group having 4 to 14 carbon atoms, $R_{259}$, $R_{260}$, $R_{263}$ and $R_{264}$ each independently represents an alkyl group having 1 to 10 carbon atoms or $R_{259}$ and $R_{260}$, $R_{263}$ and $R_{264}$ each independently represents a alkylene group having 4 or more carbon atoms forming ring structure.).

Further, in the Knoevenagel reaction, a copolymer can be obtained using the same method described in Journal of Organic Chemistry, 25, p. 813 (1959), Makromolecular Chemie, 74, p. 71 (1964), and the like.

Namely, a dialdehyde compound represented by the formula (7) and a compound represented by the formula (8) are polycondensed.

$$OHC-Ar_7-CHO \quad (7)$$

$$H_2(CN)C-Ar_8-CH_2(CN) \quad (8)$$

(wherein, $Ar_7$ and $Ar_8$ have the same definition as for $Ar_1$ in the formula (1) or $Ar_2$ in the formula (2), with the proviso that the group represented by Arl in the formula (1) has to be contained in given amount after polymerization.)

Specifically, there is an example in which a corresponding diacetonitrile. compound, for example, p-phenylenediacetonitrile and a corresponding dialdehyde compound, for example, 2,5-dioctyloxyterephthalaldehyde are polymerized in a tert-butanol/tetrahydrofuran mixed solvent using tetrabutylammonium hydroxide. When two or more kinds of diacetnitriles and/or two or more kinds of dialdehyde compounds are reacted, a copolymer comprising all of these monomers are obtained. Since both of the Wittig reaction and Knoevenagel reaction can be carried out using lithium ethoxide and the like, when a dialdehyde compound, a diphosphonium salt compound and a diacetonitrile compound are mixed in suitable amounts and reacted, all of the copolymers are obtained.

When a specific stable group is introduce into the main chain as a terminal group, the above-described reaction may advantageously be followed by a reaction with a monofunctional compound forming the terminal group. This monofunctional compound is suitably selected depending on the reaction used or, the amount of the monomers used in the reaction when two monomers having different functional groups are used. Namely, in the Wittig reaction, since the terminal is composed of a phosphonium salt or aldehyde, a monofunctional compound having an aldehyde group or phosphonium salt is selected respectively. In the dehydrohalogenation method, the terminal is composed of a methyl halide group, in the sulfonium salt decomposition method, the terminal is composed of a sulfonium salt group, and in the Knoevenagel reaction, the terminal is composed of an aldehyde group or an active methylene group, for example, an acetonitrile group, therefore, monofunctional compounds reacting with respective polymerization ends are reacted.

Among them, the Wittig reaction is preferable from the standpoints of control of the reaction and the yield thereof.

When these polymer are used as luminescent materials of an organic EL device, it is preferable to conduct purification treatment such as re-precipitation purification, fractionation by chromatography, and the like, after synthesis since the purity exerts influence on luminescent property.

The structure of an organic EL device fabricated by using the polymeric fluorescent substance of the present invention will be described below.

The organic EL device (3) of the present invention is an organic electroluminescence device having at least a light emitting layer between a pair of electrodes consisting of an anode and a cathode at least one of which is transparent or semitransparent, wherein the light emitting layer contains the polymeric luminescent substance according to any of claims 1 to 3. Known structure can be adopted without specific restriction providing a luminescent material composed of the polymeric fluorescent substance of the present invention is used in the light emitting layer.

Of them, preferable are an organic EL device in which a light emitting layer is provided between the cathode and the anode, an organic EL device in which a layer containing an electron transporting compound is provided between the cathode and the light emitting layer, an organic EL device in which a layer containing a hole transporting compound is provided between the anode and the light emitting layer, and an organic EL device in which a layer containing an electron transporting compound is provided between the cathode and the light emitting layer and a layer containing a hole transporting compound is provided between the anode and the light emitting layer.

Concretely, following structures of (a) to (e) are illustrated.

(a) Anode/light emitting layer/cathode,
(b) Anode/hole transporting layer/light emitting layer/cathode,
(c) Anode/light emitting layer/electron transporting layer/cathode, and
(d) Anode/hole transporting layer/light emitting layer/electron transporting layer/cathode.

Here, "/" shows each layer is laminated adjacently, and a light emitting layer is a layer having the function of emitting light. The polymeric fluorescent substance of the present invention is used for a light emitting layer, and it can be used two or more light emitting layers.

A hole transporting layer is a layer having the function of transporting a hole, and an electron transporting layer is a layer having the function of transporting an electron. In addition, an electron transporting layer and a hole transporting layer are referred generically, to as a charge transporting layer.

Among the charge transporting layers adjacent to an electrode, the layer which has a function of improving charge injection efficiency from an electrode, and has an effect of lowering a driving voltage of a device, sometimes referred to as a charge injection layer (a hole injection layer, an electronic injection layer).

Furthermore, for improving adhesion property with the electrode and charge injection property from the electrode, the above charge injection layer or an insulator layer having a film thickness of 2 nm or less, can be provided adjacently to the electrode.

Moreover, a thin buffer layer may be inserted in the interfaces of a charge transporting layer and a light emitting layer for improving adhesion property of the interface and for preventing mixing of the interface, etc.

About the laminating order or number of the layers, and the thickness of each layer can be used arbitrarily with taking into consideration of luminous efficiency and device life time.

A polymeric LED which contains a charge injection layer (an electron injection layer, hole injection layer) in the present invention include a polymeric LED having a charge injection layer adjacent to the cathode, and a polymeric LED having a charge injection layer adjacent to the anode.

Concretely, following structures of (e) to (p) are exemplified.

(e) Anode/charge injection layer/light emitting layer/cathode,
(f) Anode/light emitting layer/charge injection layer/cathode,
(g) Anode/charge injection layer/light emitting layer/charge injection layer/cathode,
(h) Anode/charge injection layer/light transporting layer/light emitting layer/cathode,
(i) Anode/hole transporting layer/light emitting layer/charge injection layer/cathode, (j) Anode/charge injection layer/hole transporting layer/light emitting layer/charge injection layer/cathode,
(k) Anode/charge injection layer/light emitting layer/electron transporting layer/cathode,
(l) Anode/light emitting layer/electron transporting layer/charge injection layer/cathode,
(m) Anode/charge injection layer/light emitting layer/electron transporting layer/charge injection layer/cathode,
(n) Anode/charge injection layer/hole transporting layer/light emitting layer/electron transporting layer/cathode,
(o) Anode/hole transporting layer/light emitting layer/electron transporting layer/charge injection layer/cathode, and
(p) Anode/charge injection layer/hole transporting layer/light emitting layer/electron transporting layer/charge injection layer/cathode.

Concrete examples of the charge injection layer include: a layer containing a conductive polymer, a layer provided between an anode and a hole transporting layer, which contains a material having an ionization potential of the middle value of between that of the anode material and that of the hole transporting material contained in a hole transporting layer; and a layer provided between a cathode and an electron transporting layer, which contains a material having an electron affinity of the middle value of between that of the cathode material and that of the electron transporting material contained in a electron transporting layer.

In the case that the above charge injection layer is a layer containing a conductive polymer, the electric conductivity of the conductive polymer is preferably $10^{-5}$ S/cm or more, and $10^3$ S/cm or less.

In order to reduce leak current between light emitting pixels, it is preferably $10^{-5}$ S/cm or more, and $10^2$ or less, and more preferably $10^{-5}$ S/cm or more, and $10^1$ or less.

Usually, in order to make the electric conductivity of the conductive polymer $10^{-5}$ S/cm or more, and $10^2$ or less, a proper quantity of ions is doped to the conductive polymer. The doped ion is anion in case of a hole injection layer, and it is cation in case of an electronic injection layer.

Examples of anion include a polystyrene sulfonic acid ion, an alkylbenzene sulfonic acid ion, a camphor sulfonic acid ion, etc.

Examples of cation include a lithium ion, a sodium ion, a potassium ion, a tetrabutylammonium ion, etc.

As for the film thickness of the charge injection layer, it is, for example, 1 nm–100 nm, and preferably 2 nm–50 nm.

Materials used for the charge injection layer can be selected suitably in relation with the electrode and the material of the adjacent layer. Examples of them include: conductive polymers, such as polyaniline and its derivative, polythiophene and its derivative, polyphenylenevinylene and its.derivative, polythienylenevinylene and its derivative; metal phthalocyanine (copper phthalocyanine etc.); and carbon, etc.

An insulator layer having a thickness of 2 nm or less, has a function which improves a charge injection.

Examples of the material for the above insulator layer include, metal fluoride, metal oxide, organic insulating material, etc.

Examples of a polymeric LED having an insulator layer whose film thickness is 2 nm or less, include: a polymeric LED having an insulator layer whose film thickness is 2 nm or less adjacent to a cathode; and a polymeric LED having an insulator layer whose film thickness is 2 nm or less adjacent to an anode.

Concretely, following structure of (q) to (ab) are exemplified.
(q) anode/insulator layer having a film thickness of 2 nm or less/light emitting layer/cathode,
(r) anode/light emitting layer/insulator layer having a film thickness of 2 nm or less/cathode,
(s) anode/insulator layer having a film thickness of 2 nm or less/light emitting layer/insulator layer having a film thickness of 2 nm or less/cathode,
(t) anode/insulator layer having a film thickness of 2 nm or less/hole transporting layer/light emitting layer/cathode,
(u) anode/hole transporting layer/light emitting layer/insulator layer having a film thickness of 2 nm or less/cathode,
(v) anode/insulator layer having a film thickness of 2 nm or less/hole transporting layer/light emitting layer/insulator layer having a film thickness of 2 nm or less/cathode,
(w) anode/insulator layer having a film thickness of 2 nm or less/light emitting layer/electron transporting layer/cathode,
(x) anode/light emitting layer/electron transporting layer/insulator layer having a film thickness of 2 nm or less/cathode,
(y) anode/insulator layer having a film thickness of 2 nm or less/light emitting layer/electron transporting layer/insulator layer having a film thickness of 2 nm or less/cathode,
(z) anode/insulator layer having a film thickness of 2 nm or less/hole transporting layer/light emitting layer/electron transporting layer/cathode,
(aa) anode/hole transporting layer/light emitting layer/electron transporting layer/insulator layer having a film thickness of 2 nm or less/cathode, and
(ab) anode/insulator layer having a film thickness of 2 nm or less/hole transporting layer/light emitting layer/electron transporting layer/insulator layer having a film thickness of 2 nm or less/cathode.

The form, size, material, fabrication method and the like of the organic EL device of the present invention having such structure are appropriately selected depending on use of the organic EL device and the like and are not particularly restricted.

Use of each one layer of a light emitting layer and a charge transporting layer and also use of combination of several layers are included in the present invention. Further, for example, luminescent materials described below other than the polymeric fluorescent substance may be mixed and used in the light emitting layer. Also, a layer obtained by dispersing the polymeric fluorescent substance and/or charge transporting material in a polymeric compound can be used.

The charge transporting material used together with the polymeric fluorescent substance of the present invention, namely, an electron transporting material or a hole transporting material is not particularly restricted and known materials can be used. Examples of the hole transporting material include a pyrazoline derivative, arylamine derivative, stylbene derivative, triphenyldiamine derivative and the like, and examples of the electron transporting material include an oxadiazole derivative, anthraquinodimethane or derivative thereof, benzoquinone or derivative thereof, naphthoquinone or derivative thereof, anthraquinone or derivative thereof, tetracyanoanthraquinodimethane or derivative thereof, fluorenone derivative, diphenyldicyanoethylene or derivative thereof, diphenoquinone derivative, metal complexes of 8-hydroxyquinoline or derivative thereof, and the like.

Specifically, there are exemplified those described in JP-A-57-101844, 58-197043, 58-32372, 58-15936, 59-15251, 61-170747, 2-36270, 2-210451, 2-151605, 63-70257, 63-175860, 2-135359, 2-135361, 2-209988, 3-37992, 3-152184, and the like As the hole transporting material, a triphenyldiamine derivative is preferable, and as the electron transporting material, an oxadiazole derivative, benzoquinone or derivative thereof, anthraquinone or derivative thereof, and metal complexes of 8-hydroxyquinoline or derivative thereof are preferable. Specifically, as the hole transporting material, 4,4'-bis(N-(3-methylphenyl)-N-phenylamino)biphenyl is preferable, and as the electron transporting material, 2-(4-biphenylyl)-5-(4-t-butylphenyl)-1,3,4-oxadiazole, benzoquinone, anthraquinone, tris(8-quinolinol)aluminum are preferable.

Of them, either one of electron transporting compounds and hole transporting compounds may be used or both of them may be used simultaneously. These may be used alone or in combination of two or more.

When a charge transporting layer (means generic name of a hole transporting layer and an electron transporting layer) is provided between a light emitting layer and an electrode, these charge transporting materials may be used to form a charge transporting layer.

Further, when an electron transporting material is mixed in a light emitting layer, the amount used of the charge transporting material differs also depending on the kind of compounds used, therefore, the amount used may be appropriately determined within the range which does not disturb sufficient film-forming property and luminescent property with considering these properties. Usually, it is preferably from 1 to 40% by weight, more preferably from 2 to 30% by weight based on the amount of a luminescent material.

Known luminescent materials which can be used together with the polymeric fluorescent substance of the present invention are not particularly restricted, and for example, a naphthalene derivative, anthracene or derivative thereof, perylene or derivative thereof, dyes of polymethyne type, xanthene type, coumarin type, and cyanine type, metal complexes of 8-hydroxyquinoline or derivative thereof, aromatic amine, tetraphenylcyclopentadiene or derivative thereof, tetraphenylbutadine or derivative thereof, and the like can be used. Specifically, known compounds such as those described in, for example, JP-A Nos. 57-51781 and 59-194393 can be used.

Typical methods for fabricating an organic EL device using the polymeric fluorescent substance of the present invention will be described below. Regarding a pair of electrodes composed of an anode and a cathode, as a transparent or semi-transparent electrode there is used that which is obtained by forming transparent or semi-transparent electrodes on a transparent substrate such as a glass, transparent plastic and the like.

As the material of the anode, a conductive metal oxide film, a semi-transparent metal film and the like are used. Specifically, indium-tin-oxide (ITO), films(e.g. NESA) made of conductive glasses such as tin oxide ($SnO_2$) and the like, a metal film of Au, Pt, Ag, Cu and the like, are used. As the production method, a vacuum deposition method, sputtering method, plating method and the like are used.

Subsequently, a light emitting layer containing the above-described polymeric fluorescent substance, or the above-described polymeric fluorescent substance and a charge transporting material as luminescent materials is formed on this anode. As the method for forming the light emitting layer, there are exemplified a spin coating method, casting method, dipping method, bar coating method, roll coating method, gravure coating method, flexographic printing method, spray coating method, ink jet printing method and the like using melted liquid, solution or mixed liquid. It is particularly preferable to form a film from a solution or mixed liquid by a coating method such as a spin coating method, casting method, dipping method, bar coating method, roll coating method, gravure coating method, flexographic printing method, spray coating method, ink jet printing method and the like.

The thickness of a light emitting layer is preferably from 1 nm to 1 $\mu$m, more preferably from 2 nm to 500 nm. A range from 5 to 200 nm is preferable for enhancing luminous efficiency by increasing current density.

When a film is formed by a coating method, it is desirable to conduct heating and drying preferably at a temperature from 30 to 300° C., more preferably from 60 to 200° C. for removing a solvent under reduced pressure or inert atmosphere.

When the light emitting layer and charge transporting layer are laminated, it is preferable that a hole transporting layer is formed on an anode before forming a light emitting layer by the above-described film-forming method, and/or after a light emitting layer is formed, an electron transporting layer is formed thereon.

The method for forming a charge transporting layer is not particularly restricted, and there can be used a method of vacuum deposition from in the powdered state of these compounds, a method of applying a solution or a mixed solution of these compounds by a spin coating method, casting method, dipping method, bar coating method, roll coating method, gravure coating method, flexographic printing method, spray coating method, ink jet printing method and the like, a method of applying a melt, a solution or a mixed solution of a polymeric compound and a charge transporting material by a spin coating method, casting method, dipping method, bar coating method, roll coating method, gravure coating method, flexographic printing method, spray coating method, ink jet printing method and the like.

The polymeric compound to be mixed is not particularly restricted and preferably is a compound which does not significantly disturb charge transportation, and a compound which does not reveal strong absorption of visible light is suitably used.

A polymeric compound having charge transporting property can be used in a charge transporting layer without mixing with a charge transporting material having low molecular weight.

As the polymeric compound, there are exemplified poly (N-vinylcarbazole), polyaniline or derivative thereof, polythiophene or derivative thereof, poly(p-phenylenevinylene) or derivative thereof, poly(2,5-thienylenevinylene) or derivative thereof, polycarbonate, polyacrylate, polymethyl methacrylate, polystyrene, polyvinyl chloride, polysiloxane and the like. A coating method is preferably used since film-forming can be conducted easily.

The charge transporting layer is required to have at least such thickness that does not generate pinholes, however, too large thickness is not preferable since resistance of a device increases and high driving voltage is required. Therefore, the thickness of a charge transporting layer is preferably from 1 nm to 1 $\mu$m, more preferably from 2 nm to 500 nm, particularly preferably from 5 nm to 200 nm.

Then, an cathode is provided on a light emitting layer or electron transporting layer. This cathode will act as an electron injecting cathode. The material thereof is not particularly restricted, and a material having low work function is preferable. For example, Al, In, Mg, Ca, Li, Mg—Ag alloy, In—Ag alloy, Mg—In alloy, Mg—Al alloy, Mg—Li alloy, Al—Li alloy, Al—Ca alloy, graphite film and the like are used. A vacuum deposition method, sputtering method and the like are used for producing a cathode.

In the present invention, the reason why the polymeric fluorescent substance functions as a luminescent material having long wave length is that long wavelength fluorescence from orange to red is given since the polymeric fluorescent substance has a divalent condensed polycyclic aromatic group of specific size having a bonding site at specific position.

EXAMPLE

Examples will be described below for illustrating the present invention in detail, however, the present invention is not restricted to them.

<Calculation of Atomic Orbital Coefficient of Highest Occupied Molecular Orbital and Selection of Carbon Atom Having Bonding Part>

Atomic orbital coefficients of pyrene, perylene and coronene which are examples of a condensed polycyclic aromatic compound obtained by substituting all substitutents of $Ar_1$ by hydrogen atoms and bonding hydrogen atoms to two bonding parts, were calculated using a molecular orbital calculation program, MOPAC 93 Revision Number 2 (JCPE program number: P081) by AM1 method while optimizing structure (key word: AM1 PRECISE EF LET DDMIN=0.0 PULAY VECTORS). A calculator, IBM RS/6000 39H was used. Position numbers of carbon atom of respective molecules are shown in Formula (II). The calculation results are shown in Table 1.

Two carbon atoms having bonding parts can be selected from this table.

Specifically, in pyrene, two carbon atoms which are not adjacent are selected from position numbers of carbon atom 1, 3, 6, 8, 4, 5, 9, 10 and in perylene, two carbon atoms which are not adjacent are selected from position numbers of carbon atom 3, 4, 9, 10, 1, 6, 7, 12.

In coronene, two HOMOs are present, and in either case, two carbon atoms having bonding parts are two carbon atoms which are not adjacent of position numbers 1, 7, 6, 12.

TABLE 1

| Compound | Position numbers of carbon atom (see Formula II) | Sum of (atomic orbital coefficient)$^2$ of each carbon atom $\rho_m^{HOMO}$ | Whether carbon atoms at these position numbers can have a bonding part or not |
|---|---|---|---|
| Pyrene | 1, 3, 6, 8 | 0.12 | Yes |
|  | 4, 5, 9, 10 | 0.084 | Yes |
|  | 2, 7 | 0.0 | No |
| Perylene | 3, 4, 9, 10 | 0.086 | Yes |
|  | 1, 6, 7, 12 | 0.077 | Yes |
|  | 2, 5, 8, 11 | 0.019 | No |
| Coronene HOMO1 | 1, 7 | 0.085 | Yes |
|  | 6, 12 | 0.079 | Yes |
|  | 2, 8 | 0.053 | No |
|  | 3, 9 | 0.044 | No |
|  | 5, 11 | 0.007 | No |
|  | 4, 10 | 0.003 | No |
| Coronene HOMO2 | 1, 7 | 0.087 | Yes |
|  | 6, 12 | 0.083 | Yes |
|  | 2, 8 | 0.046 | No |
|  | 3, 9 | 0.037 | No |

TABLE 1-continued

| Compound | Position numbers of carbon atom (see Formula II) | Sum of (atomic orbital coefficient)$^2$ of each carbon atom $\rho_m^{HOMO}$ | Whether carbon atoms at these position numbers can have a bonding part or not |
|---|---|---|---|
|  | 5, 11 | 0.011 | No |
|  | 4, 10 | 0.005 | No |

[Formula (II)]

Pyrene

Perylene

Coronene

<Measurement of Number-average Molecular Weight>

The polystyrene-reduced number-average molecular weight was obtained by gel permeation chromatography (GPC) using chloroform as a solvent.

<Absorption Spectrum, Fluorescent Spectrum>

A 0.4% chloroform solution of a polymeric fluorescent substance was spin-coated on a quartz plate to form a film of a polymeric fluorescent substance. The ultraviolet visible absorption spectrum and fluorescent spectrum of this film were measured by an auto-recording spectrophotometer, UV 365 manufactured by Shimadzu Corp. and a fluorescent spectrophotometer, 850 manufactured by Hitachi Ltd., respectively.

<Evaluation of Heat-resistance by Differential Scanning Calorimetry>

Thermal analysis of a polymeric fluorescent substance was conducted using a differential scanning calorimeter, DSC 200 manufactured by Seiko Instrument Inc. Any sample revealed endothermic peak which is believed to correspond to softening of a polymer.

Reference Synthesis Example 1
<Synthesis of Dibromopyrene>

Pyrene (manufactured by Tokyo Chemical Industry Co., Ltd.) was reacted with 2-fold equivalent of bromine under reflux in a carbon teterachloride solvent to synthesize dibromopyrene. The ratio of 1,6-dibromopyrene to 1,8- dibromopyrene was found to be about 1:2 by integration ratio of protons by $^1$H-NMR.
<Synthesis of Dibromoperylene>

Perylene (manufactured by Tokyo Chemical Industry Co.,Ltd.) was reacted with 2-fold equivalent of bromine under reflux in a carbon teterachloride solvent to synthesize dibromoperylene. The ratio of 3,6-dibromoperylene to 3,9-dibromoperylene was found to be about 1:1 by integration ratio of protons by $^1$H-NMR.

Reference Synthesis Example 2
<Synthesis of Pyrenedicarboxyaldehyde>

Dibromopyrene synthesized in Reference Synthesis Example 1 was lithiated with butyllithium at −78° C. in a tetrahydrofuran solvent, then reacted with N,N-dimethylformaide to synthesize pyrenedicarboxyaldehyde. The ratio of 1,6-pyrenedicarboxyaldehyde to 1,8-pyrenedicarboxyaldehyde was found to be about 1:2 by integration ratio of protons by $^1$H-NMR.
<Synthesis of Perylenedicarboxyaldehyde>

Dibromoperylene synthesized in Reference Synthesis Example 1 was lithiated with butyllithium at −78° C. in a tetrahydrofuran solvent, then reacted with N,N-dimethylformaide to synthesize perylenedicarboxyaldehyde. The ratio of 3,6-perylenedicarboxyaldehyde to 3,9-perylenedicarboxyaldehyde was found to be about 1:1 by integration ratio of protons by $^1$H-NMR.

Example 1
<Polymeric Fluorescent Substance 1>

2-methoxy-5-(2'-ethylhexyloxy)-p-xylylene dichloride was reacted with tri-n-butylphosphine in an acetone solvent to synthesize a phosphonium salt. 3.68 g of the resulted phosphonium salt and 1.29 g of pyrenedicarboxyaldehyde were dissolved in an ethanol/chloroform mixed solvent. To this solution was added dropwise a solution prepared by dissolving 5 ml of 12% lithium methoxide methanol solution into 20 ml of ethanol. After the addition, the reaction was conducted subsequently for 5 hours at room temperature.

After left overnight at room temperature, the generated precipitate was recovered, washed with ethanol, dissolved in methylene chloride, after removing insoluble components, methanol was added to this solution for re-precipitation, and the generated precipitate was recovered. This precipitate was washed with ethanol, then, dried under reduced pressure to obtain 0.3 g of a polymer. The resulted polymer is called polymeric fluorescent substance 1.

The repeating unit of polymeric fluorescent substance 1 estimated by the feed ratio of monomers and the kind of polymerization reaction is shown by the following formula (9)(wherein, pyrenediyl group represents 1,6- and 1,8-pyrenedily groups).

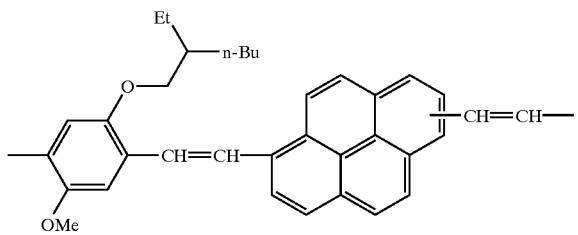

(9)

The polystyrene-reduced number average molecular weight of polymeric fluorescent substance 1 was 3.3×10$^3$. The $^1$H-NMR of this polymeric fluorescent substance 1 showed a spectrum which corresponds to a polymer having the repeating unit represented by the formula (9). Polymeric fluorescent substance 1 could be easily dissolved in chloroform.

The fluorescence peak wavelength of polymeric fluorescent substance 1 was 656 nm and the temperature at which DSC endothermic peak was shown was 57.3° C.

Ar$_1$ in polymeric fluorescent substance 1 represents 1,6- and 1,8-pyrenediyl groups, and the condensed polycyclic aromatic compound is pyrene and has a plane of symmetry and twofold axis vertical to the plane including pyrene.

The carbon atoms having a bonding part should be two selected from 1, 3, 6, 8, 4, 5, 9, 10 which are not adjacent, as is known from the calculation regarding pyrene. The pyrenediyl group in polymeric fluorescent substance 1 satisfies this requirement since it has a bonding part on 1,6 or 1,8 carbon atom.

<Fabrication and Evaluation of Device>

A chloroform solution of polymeric fluorescent substance 1 obtained above was coated by a spin coating method on a glass substrate on which a 200 nm thick ITO film had been provided by sputtering to form a film of polymeric fluorescent substance 1 having a thickness of 40 nm as a light emitting layer. Subsequently, this was dried at 120° C. for 1 hour under reduced pressure, then, 50 nm of tris(8-quinolinol)aluminum (Alq$_3$) was deposited as an electron transporting layer on the light emitting layer. Finally, 100 mm of aluminum-lithium alloy (Al:Li=99:1 by weight) was deposited as a cathode on the electron transporting layer, to obtain an organic EL device having two-layer structure. The degrees of vacuum during the deposition were all 8×10$^{-6}$ torr or less.

When voltage of about 10 V was applied to this device, red EL luminescence of polymeric fluorescent substance 1 was observed. The EL peak wavelength was 680 nm.

Example 2
<Polymeric Fluorescent Substance 2>

2-methoxy-5-octyloxy-p-xylylene dichloride was reacted with triphenylphosphine in a N,N-dimethylformamide solvent to synthesize a phosphonium salt. 4.29 g of the resulted phosphonium salt and 1.29 g of pyrenedicarboxyaldehyde were dissolved in an ethanol/chloroform mixed solvent. To this solution was added dropwise a solution prepared by dissolving 5 ml of 12% lithium methoxide methanol solution into 20 ml of ethanol. After the addition, the reaction was conducted subsequently for 5 hours at room temperature.

After left overnight at room temperature, the generated precipitate was recovered, washed with ethanol, subsequently washed with an ethanol/ion-exchang water mixed solvent, and further washed with ethanol. This precipitate was dried under reduced pressure to obtain 1.0 g of a polymer. The resulted polymer is called polymeric fluorescent substance 2.

The repeating unit of polymeric fluorescent substance 2 estimated by the feed ratio of monomers and the kind of polymerization reaction is shown by the following formula (10) (wherein, pyrenediyl group represents 1,6- and 1,8-pyrenedily groups).

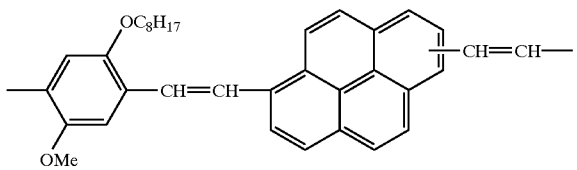

(10)

The polystyrene-reduced number average molecular weight of polymeric fluorescent substance 2 was $7.9 \times 10^3$. The $^1$H-NMR of this polymeric fluorescent substance 2 showed a spectrum which corresponds to a polymer having the repeating unit represented by the formula (10). Polymeric fluorescent substance 2 could be easily dissolved in chloroform. The fluorescence peak wavelength of polymeric fluorescent substance 2 was 608 nm and the temperature at which DSC endothermic peak was shown was 24.4° C.

$Ar_1$ in polymeric fluorescent substance 2 represents 1,6- and 1,8-pyrenediyl groups, namely satisfied the condition of the present invention as described in Example 1.

Example 3
<Polymeric Fluorescent Substance 3>

2-methoxy-5-(2'-ethylhexyloxy)-p-xylylene dichloride was reacted with triphenylphosphine in a N,N-dimethylformamide solvent to synthesize a phosphonium salt. 2.57 g of the resulted phosphonium salt and 0.93 g of perylenedicarboxyaldehyde were dissolved in an ethanol/chloroform mixed solvent. To this solution was added dropwise a solution prepared by dissolving 5 ml of 12% lithium methoxide methanol solution into 20 ml of ethanol. After the addition, the reaction was conducted subsequently for 5 hours at room temperature.

After left overnight at room temperature, the generated precipitate was recovered, washed with ethanol, subsequently washed with an ethanol/ion-exchang water mixed solvent, and further washed with ethanol. This precipitate was dried under reduced pressure to obtain 0.9 g of a polymer. The resulted polymer is called polymeric fluorescent substance 3.

The repeating unit of polymeric fluorescent substance 3 estimated by the feed ratio of monomers and the kind of polymerization reaction is shown by the following formula (11)(wherein, perylenediyl group represents 3,6- and 3,9-perylenedily groups).

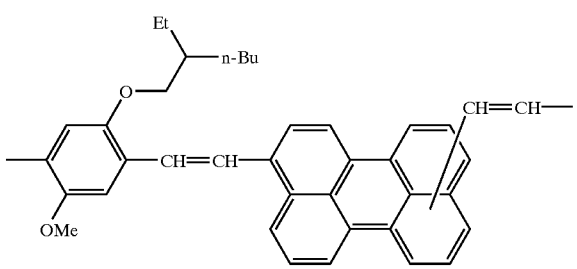

(11)

The polystyrene-reduced number average molecular weight of polymeric fluorescent substance 3 was $2.6 \times 10^3$. The $^1$H-NMR of this polymeric fluorescent substance 3 showed a spectrum which corresponds to a polymer having the repeating unit represented by the formula (11). Polymeric fluorescent substance 3 could be easily dissolved in chloroform.

$Ar_1$ in polymeric fluorescent substance 3 represents 3,6- and 3,9-perylenediyl groups, and the condensed polycyclic aromatic compound is perylene and a plane of symmetry and twofold axis vertical to the plane including perylene.

The carbon atoms having a bonding part should be two selected from 3, 4, 9, 10, 1, 6, 7, 12 which are not adjacent, as is known from the calculation regarding perylene.

The pyrenediyl group in polymeric fluorescent substance 3 satisfies this requirement since it has a bonding part on 3,6 or 3,9 carbon atom.

Example 4
<Polymeric Fluorescent Substance 4>

2-methoxy-5-(2'-ethylhexyloxy)-p-xylylene dichloride was reacted with triphenylphosphine in a N,N-dimethylformamide solvent to synthesize a phosphonium salt. 4.29 g of the resulted phosphonium salt, 1.56 g of 2,5-dioctyloxyterephthalaldehyde and 0.31 g of perylenedicarboxyaldehyde were dissolved in an ethanol/chloroform mixed solvent. To this solution was added dropwise a solution prepared by dissolving 5 ml of 12% lithium methoxide methanol solution into 20 ml of ethanol. After the addition, the reaction was conducted subsequently for 5 hours at room temperature.

After left overnight at room temperature, the generated precipitate was recovered, washed with ethanol, subsequently washed with an ethanol/ion-exchang water mixed solvent, and further washed with ethanol. This precipitate was dried under reduced pressure to obtain 2.0 g of a polymer. The resulted polymer is called polymeric fluorescent substance 4.

The repeating units of polymeric fluorescent substance 4 are represented by the following formula (12) and (13). Depending on the feed ratio of monomers and the kind of polymerization reaction, the formula (12) and (13) are bonded randomly to form a random copolymer (wherein, perylenediyl group represents 3,6- and 3,9-perylenedily groups, and the ratio of the repeating unit (12) to the repeating unit (13) is 1:4).

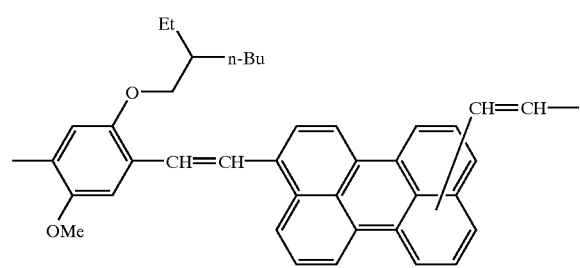

(12)

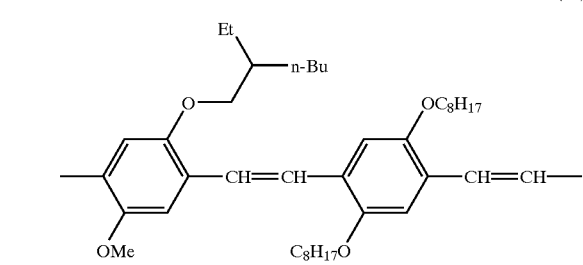

(13)

The polystyrene-reduced number average molecular weight of polymeric fluorescent substance 4 was $1.4 \times 10^4$. The $^1$H-NMR of this polymeric fluorescent substance 4 showed a spectrum which corresponds to a random copolymer having the repeating unit represented by the formula (12) and the repeating unit represented by the formula (13). Polymeric fluorescent substance 4 could be easily dissolved in chloroform.

$Ar_1$ in polymeric fluorescent substance 4 represents 3,6- and 3,9-perylenediyl groups, satisfies the condition of the present invention as described in Example 3.

<Fabrication and Evaluation of Device>

A 1,2-dichloroethane solution of poly(N-vinylcarbazole) was coated by a spin coating method on a glass substrate on which a 200 nm thick ITO film had been provided by sputtering to form a film of poly(N-vinylcarbazole) having a thickness of 60 nm as a hole transporting layer. Further, a mesitylene solution of polymeric fluorescent substance 4 obtained above was coated by a spin coating method on the hole transporting layer to form a film of polymeric fluorescent substance 4 having a thickness of 40 nm as a light emitting layer. Subsequently, this was dried at 120° C. for 1 hour under reduced pressure, then, 100 nm of aluminum-lithium alloy (Al:Li=99:1) was deposited as a cathode on the light emitting layer, to obtain an organic EL device having two-layer structure. The degrees of vacuum during the deposition were all $8 \times 10^{-6}$ torr or less.

When voltage of about 6 V was applied to this device, EL luminescence of polymeric fluorescent substance 4 was observed. The EL peak wavelength was 592 nm.

Comparative Example 1
<Polymeric Fluorescent Substance 5>

2,5-dioctyloxy-p-xylylene dichloride was reacted with triphenylphosphine in a N,N-dimethylformamide solvent to synthesize a phosphonium salt. 9.55 g of the resulted phosphonium salt and 1.34 g of terephthalaldehyde were dissolved in an ethanol solvent. To this solution was added dropwise a solution prepared by dissolving 9.5 ml of 12% lithium methoxide methanol solution into 40 ml of ethanol. After the addition, the reaction was conducted subsequently for 5 hours at room temperature.

After left overnight at room temperature, the generated precipitate was recovered, washed with ethanol, dissolved in toluene, and ethanol was added to this solution for re-precipitation. This dissolution and re-precipitation procedure was repeated twice. The resulted precipitate was dried under reduced pressure to obtain 0.8 g of a polymer. The resulted polymer is called polymeric fluorescent substances 5.

The repeating unit of polymeric fluorescent substance 5 estimated by the feed ratio of monomers and the kind of polymerization reaction is shown by the following formula (14).

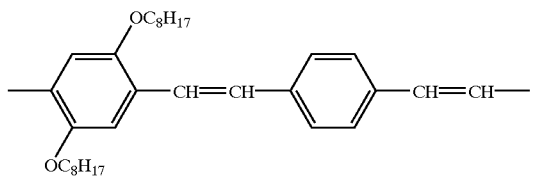

(14)

The polystyrene-reduced number average molecular weight of polymeric fluorescent substance 5 was $1.1 \times 10^4$. The $^1$H-NMR of this polymeric fluorescent substance 5 showed a spectrum which corresponds to a polymer having the repeating unit represented by the formula (14). Polymeric fluorescent substance 5 could be easily dissolved in chloroform. The fluorescence peak wavelength of polymeric fluorescent substance 5 was 532 nm and the temperature at which DSC endothermic peak was shown was 2.6° C.

Reference Synthesis Example 3
<Synthesis of n-octyl-substituted Perylene>

Dibromoperylene synthesized in the same manner as in Reference Synthesis Example 1 and 6-fold equivalent n-octyl bromide were reacted in a THF/diethyl ether mixed solvent to synthesize n-octyl-substituted perylene. $^1$H-NMR of this compound showed a spectrum which showed a spectrum which corresponds to n-octyl-substituted perylene.

<Synthesis of n-octyl-substituted Perylenedicarboxyaldehyde>

The above-described n-octyl-substituted perylene was brominated in the same manner as in Reference Synthesis Example 1, and formylated in the same manner as in Reference Synthesis Example 2 to synthesize of n-octyl-substituted perylenedicarboxyaldehyde. The structure of n-octyl-substituted perylenedicarboxyaldehyde was confirmed by FD-MS. Further, 3,6- and 3,9- perylenedicarboxyaldehyde derivative were confirmed by $^1$H-NMR.

Example 5
<Polymeric Fluorescent Substance 6>

2-methoxy-5-(2'-ethylhexyloxy)-p-xylylene dichloride was reacted with triphenylphosphine in a N,N-dimethylformamide solvent to synthesize a phosphonium salt. 1 part by weight of the resulted phosphonium salt and 0.48 parts by weight of the above-described octyl-substituted perylenedicarboxyaldehyde were dissolved in an ethanol/toluene mixed solvent. To this solution was added dropwise a solution prepared by dissolving 4 parts by weight of 12% lithium methoxide methanol solution into 16 parts by weight of ethanol. After the addition, the reaction was conducted subsequently for 4 hours at room temperature.

After left overnight at room temperature, the generated precipitate was recovered, washed with ethanol, subsequently washed with an ethanol/ion-exchang water mixed solvent, and further washed with ethanol. Subsequently, this precipitate was dissolved in toluene, and methanol was added for re-precipitation, then, washed with ethanol. This precipitate was dried under reduced pressure to obtain 0.15 parts by weight of a polymer. The resulted polymer is called polymeric fluorescent substance 6.

The polystyrene-reduced number average molecular weight of polymeric fluorescent substance 6 was $4.5 \times 10^3$. The $^1$H-NMR of this polymeric fluorescent substance 6 showed a spectrum which corresponds to a random copolymer comprising 2-methoxy-5-(2'-ethylhexyloxy)-1,4-phenylenevinylene and n-octyl-substituted perylenediylvinylene. Polymeric fluorescent substance 6 could be easily dissolved in chloroform.

$Ar_1$ in polymeric fluorescent substance 6 represents 3,6- and 3,9- perylenediyl groups, namely satisfied the condition of the present invention as described in Example 3.

Reference Synthesis Example 4
<Synthesis of bis-hydroxymethylpyrene>

Pyrenedicarboxyaldehyde synthesized in the same manner as in Reference Synthesis Examples 1 and 2 was reduced with a lithium borohydride in a THF solution under inert atmosphere to synthesize bis-hydroxymethylpyrene. A sample obtained after re-crystallization with ethanol was mainly composed of 1,6-bis-hydroxymethylpyrene and contained a small amount of 1,8-bis-hydroxymethylpyrene.

<Synthesis of bis-chloromethylpyrene>

The above-described bis-hydroxymethylpyrene was reacted with thionyl chloride in a THF solution to synthesize bis-chloromethylpyrene. Bis-chloromethylpyrene could be synthesized in the same manner from an diethyl ether solution of bis-hydroxymethylpyrene and also from the solid sample as it was.

Example 6

<Polymeric Fluorescent Substance 7>

0.08 parts by weight of the above-described bis-chloromethylpyrene and 1 part by weight of 2,5-bis-chloromethyl-4'-(3,7-dimethyloctyloxy)-biphenyl were dissolved in 200 parts by weight of absolute 1,4-dioxane under inert atmosphere and the solution was heated to 95° C. To this solution was added dropwise a absolute 1,4-dioxane solution of 0.8 parts by weight of potassium t-butoxide. The solution was further heated to 97° C., then, a absolute 1,4-dioxane solution of 0.6 parts by weight of potassium t-butoxide was added dropwise. They were reacted for 2 hours at the same condition, then, cooled and neutralized with acetic acid. The reaction solution was cooled to room temperature and poured in 500 parts by weight of water, and the precipitate was filtered off. It was purified by re-precipitation from tetrahydrofuran/methanol to obtain 0.32 parts by weight of an orange polymer. The resulted polymer is called polymeric fluorescent substance 7.

The repeating units of polymeric fluorescent substance 7 are represented by the following formula (15) and (16). Depending on the feed ratio of monomers and the kind of polymerization reaction, the formula (15) and (16) are bonded randomly to form a random copolymer (wherein, pyrenediyl group represents 1,6- and 1,8-pyrenedily groups, and the ratio of the repeating unit (15) to the repeating unit (16) is 1:9).

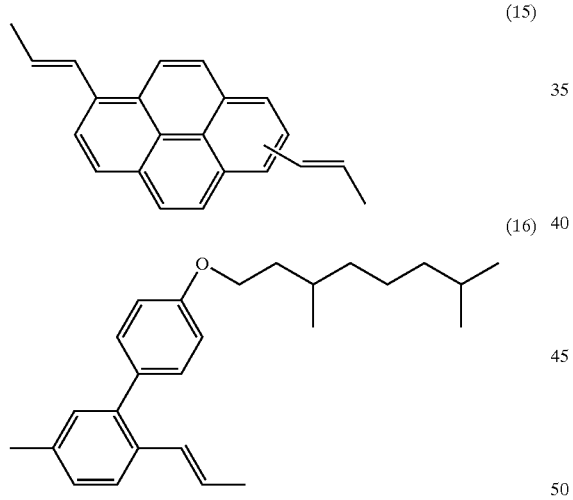

(15)

(16)

The polystyrene-reduced number average molecular weight of polymeric fluorescent substance 7 was $2.9 \times 10^5$. The $^1$H-NMR of this polymeric fluorescent substance 7 showed a spectrum which corresponds to a random copolymer having the repeating unit represented by the formula (15) and the repeating unit represented by the formula (16). Polymeric fluorescent substance 7 could be easily dissolved in chloroform.

The polymeric fluorescent substance of the present invention shown fluorescence at long wavelength from orange to red, is excellent in heat-resistance, and excellent as a material of an organic EL device. An organic EL device using this polymeric fluorescent substance is easily fabricated and reveals excellent luminescent property and heat-resistance, therefore, it is preferably used as an apparatus such as a flat light source as back light, a flat panel display and the like.

What is claimed is:

1. A polymeric fluorescent substance showing visible fluorescence in solid state and having a polystyrene-reduced number-average molecular weight of $10^3$ to $10^7$, wherein the polymeric fluorescent substance comprises one or more repeating units represented by the following formula (1) and one or more repeating units represented by the following formula (2), the sum of the repeating units represented by the formula (1) is from 0.5% by mole to 95% by mole based on the total amount of repeating units, the sum of the repeating units represented by the formula (1) and the repeating units represented by the formula (2) is from 50% by mole to 100% by mole based on the total amount of repeating units, and the molar ratio of the sum of the repeating units represented by the formula (1) to the sum of the repeating units represented by the formula (2) is from 20:1 to 1:199:

(1)

wherein $Ar_1$ represents a condensed polycyclic aromatic group which may be substituted with a substituent selected from the group consisting of a cyano group, an alkyl group having 1 to 20 carbon atoms, an alkoxy group having 1 to 20 carbon atoms, an alkylthio group having 1 to 20 carbon atoms, an alkylsilyl group having 3 to 60 carbon atoms, an alkylamino group having 1 to 40 carbon atoms, an aryl group having 6 to 20 carbon atoms, an aryloxy group having 6 to 20 carbon atoms, an arylalkenyl group having 8 to 20 carbon atoms, an arylalkynyl group having 8 to 20 carbon atoms, an aralkyl group having 7 to 14 carbon atoms and a heterocyclic compound group having 4 to 14 carbon atoms, and which satisfies the following conditions (a) to (c):

(a) bond ① and bond ② are attached to carbon atoms on $Ar_1$ that are not adjacent each other and the number of carbon atoms forming conjugated bonds, excepting any carbon atoms of said substituent, is from 16 to 30;

(b) a condensed polycyclic aromatic compound, obtained by replacing all substituents on $Ar_1$ by hydrogen atoms and by substituting hydrogen atoms at the two bonding sites ① and ②, has a plane of symmetry, a twofold rotational axis or a threefold rotational axis, said plane of symmetry or rotational axis is perpendicular to the plane including the condensed polycyclic aromatic compound and contains only 6-membered-ring structures;

(c) the two carbon atoms to which bond ① and bond ② are attached are selected from the group consisting of carbon atoms at the corresponding location to those of said condensed polycyclic aromatic compound to which a hydrogen atom is bonded; and:

the two carbon atoms on $Ar_1$ to which bond ① and bond ② are attached are selected from the group consisting of carbon atoms having the largest and second-largest sum of squares of atomic orbital coefficients in the highest occupied molecular orbitals, wherein the sum of squares of atomic orbital coefficients in the highest occupied molecular orbitals is calculated by the semi-empirical molecular orbital AM1 method; and $R_1$ and $R_2$ each independently represents a group selected from the group consisting of a hydrogen atom, an alkyl group having 1 to 20 carbon atoms, an aryl group having 6 to 20 carbon atoms, a heterocyclic compound having 4 to 20 carbon atoms and a cyano group;

 (2)

wherein $Ar_2$ represents an arylene group or a heterocyclic compound in which the number of carbon atoms forming conjugated bond is from 4 to 20, and is not the same as the $Ar_1$ group in said formula (1), and $R_3$ and $R_4$ each independently represents a group selected from the group consisting of a hydrogen atom, an alkyl group having 1 to 20 carbon atoms, an aryl group having 6 to 20 carbon atoms, a heterocyclic compound having 4 to 20 carbon atoms and a cyano group.

2. The polymeric fluorescent substance according to claim 1, wherein $Ar_1$ in said formula (1) is a group selected from the group consisting of a 1,6-pyrenediyl group, a 1,8-pyrenediyl group, a 3,6-perylenediyl group and a 3,9-perylenediyl group, which may be substituted with a substituent selected from the group consisting of a cyano group, an alkyl group having 1 to 20 carbon atoms, an alkoxy group having 1 to 20 carbon atoms, an alkylthio group having 1 to 20 carbon atoms, an alkylsilyl group having 3 to 60 carbon atoms, an alkylamino group having 1 to 40 carbon atoms, an aryl group having 6 to 20 carbon atoms, an aryloxy group having 6 to 20 carbon atoms, an arylalkenyl group having 8 to 20 carbon atoms, an arylalkynyl group having 8 to 20 carbon atoms, an aralkyl group having 7 to 14 carbon atoms and a heterocyclic compound group having 4 to 14 carbon atoms.

3. An organic electroluminescence device having at least a light emitting layer between a pair of electrodes consisting of an anode and a cathode at least one of which is transparent or semitransparent, wherein the light emitting layer contains the polymeric luminescent substance according to claim 1.

4. The organic electroluminescence device according to claim 3, wherein a layer containing an electron transporting compound is provided between the cathode and the light emitting layer.

5. The organic electroluminescence device according to claim 3, wherein a layer containing a hole transporting compound is provided between the anode and the light emitting layer.

6. The organic electroluminescence device according to claim 3, wherein a layer containing an electron transporting compound is provided between the cathode and the light emitting layer and layer containing a hole transporting compound is provided between the anode and the light emitting layer.

7. An organic electroluminescence device having at least a light emitting layer between a pair of electrodes consisting of an anode and a cathode at least one of which is transparent or semitransparent, wherein the light emitting layer contains the polymeric luminescent substance according to claim 2.

8. The organic electroluminescence device according to claim 7, wherein a layer containing an electron transporting compound is provided between the cathode and the light emitting layer.

9. The organic electroluminescence device according to claim 7, wherein a layer containing a hole transporting compound is provided between the anode and the light emitting layer.

10. The organic electroluminescence device according to claim 7, wherein a layer containing an electron transporting compound is provided between the cathode and the light emitting layer and layer containing a hole transporting compound is provided between the anode and the light emitting layer.

* * * * *